United States Patent [19]

Harada et al.

[11] Patent Number: 5,063,488

[45] Date of Patent: Nov. 5, 1991

[54] SWITCHING POWER SOURCE MEANS

[75] Inventors: Kosuke Harada, Fukuoka; Hiroshi Sakamoto, Ohnojyo, both of Japan

[73] Assignee: Kyushu University, Fukuoka, Japan

[21] Appl. No.: 530,814

[22] Filed: May 30, 1990

Related U.S. Application Data

[63] Continuation-in-part of Ser. No. 323,381, Mar. 14, 1989.

[30] Foreign Application Priority Data

Sep. 16, 1988 [JP] Japan .................................. 63-230133
Sep. 12, 1989 [JP] Japan ................................... 1-234577

[51] Int. Cl.$^5$ ............................................. H02M 3/337
[52] U.S. Cl. ........................................ 363/16; 363/132
[58] Field of Search ...................... 363/16, 17, 21, 39, 363/40

[56] References Cited

U.S. PATENT DOCUMENTS

| | | | |
|---|---|---|---|
| 4,353,112 | 10/1982 | Rietveld et al. | 363/16 |
| 4,464,709 | 8/1984 | Barter | 363/16 |
| 4,605,997 | 8/1986 | Kirk | 363/16 |
| 4,642,750 | 2/1987 | Raets | 363/21 X |
| 4,692,851 | 9/1987 | Attwood | 363/16 |
| 4,736,284 | 4/1988 | Yamagishi et al. | 363/16 |
| 4,768,141 | 8/1988 | Hubertus et al. | 363/16 |
| 4,814,962 | 3/1989 | Magalhaes et al. | 363/16 |
| 4,926,302 | 5/1990 | Harada et al. | 363/132 X |

FOREIGN PATENT DOCUMENTS 52-32525 11/1977 Japan ................................... 363/16
56-35679 4/1981 Japan ................................... 363/16

Primary Examiner—Steven L. Stephan
Assistant Examiner—Kristine Peckman
Attorney, Agent, or Firm—Spencer & Frank

[57] ABSTRACT

A switching power source means comprises a DC voltage source, a first switch element, a low-pass filter connected to the DC voltage source through the first switch element, and a second switch element connected to the input end of the low-pass filter, the switch elements being coupled to the DC voltage source either directly or through a transformer and being operable in such a manner that an output of DC or AC at a desired frequency can be derived across the output end of the low-pass filter. With the invention, a reactor is connected in parallel across the input end of the low-pass filter, to charge and discharge parasitic capacitances of the switch elements, preferably by being provided with a saturable core accompanied by an additional winding supplied with a load current, thus preventing surge currents in the switch elements.

14 Claims, 9 Drawing Sheets

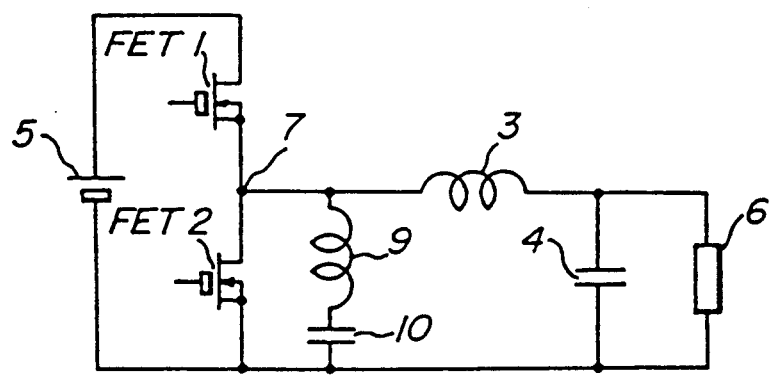
FIG_1

FIG._3
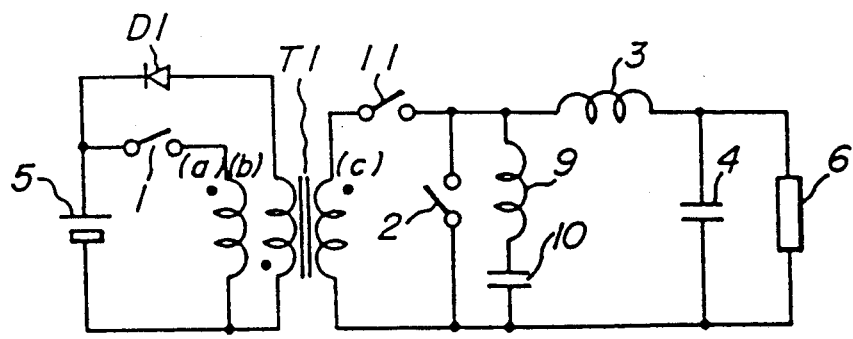
FIG._4
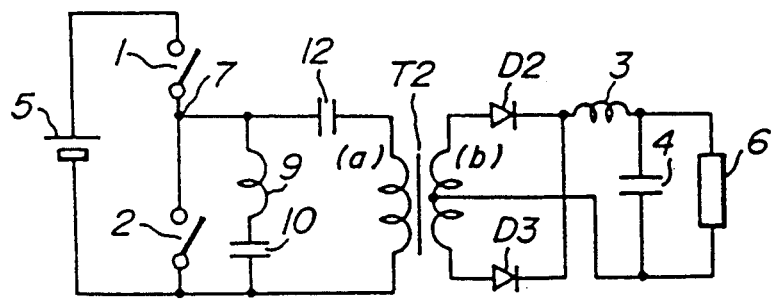
FIG._5
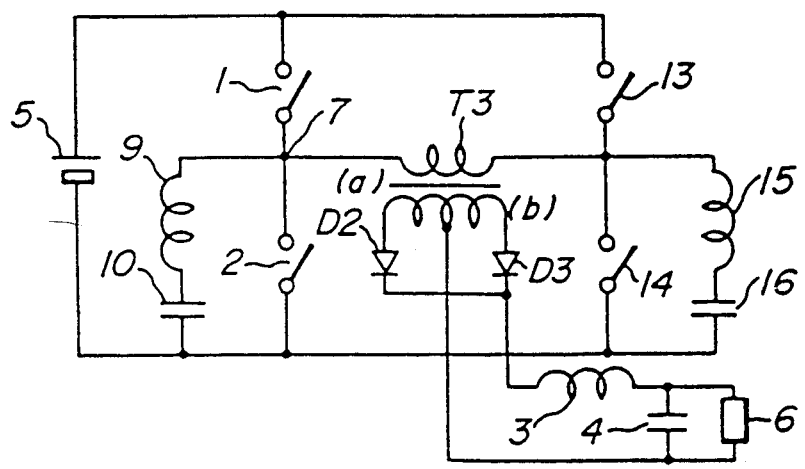

FIG._8 PRIOR ART
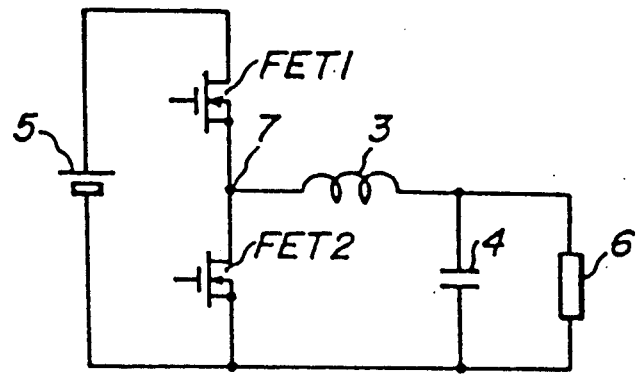
FIG._9 PRIOR ART
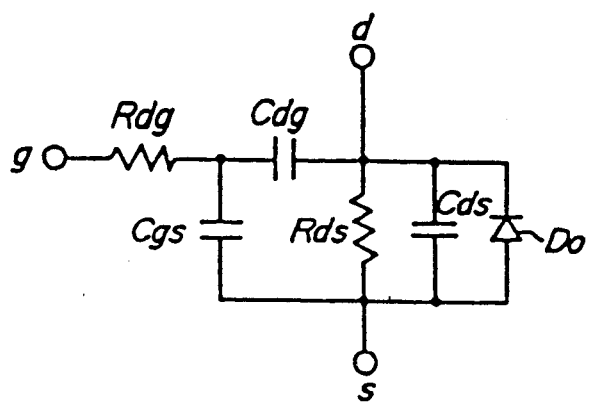
FIG._10A PRIOR ART
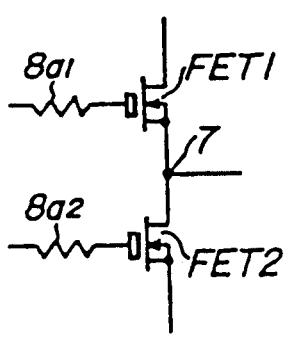
FIG._10B PRIOR ART
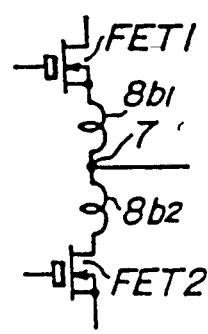
FIG._10C PRIOR ART
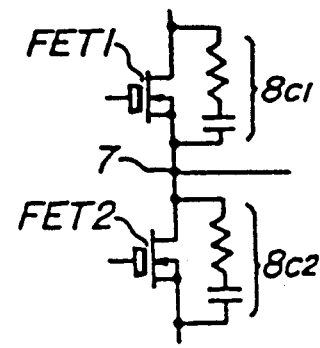

FIG_11
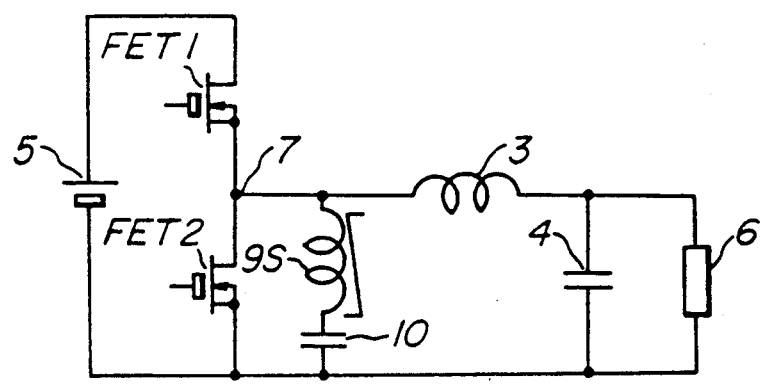

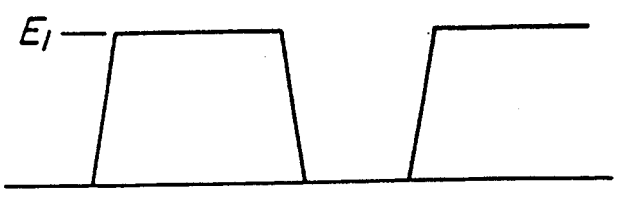
FIG_12A
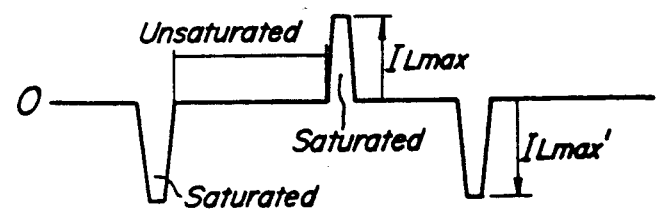
FIG_12B
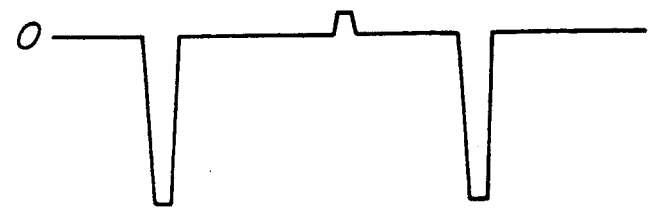
FIG_12C
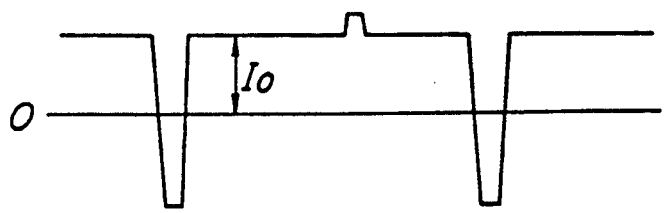
FIG_12D

FIG_13
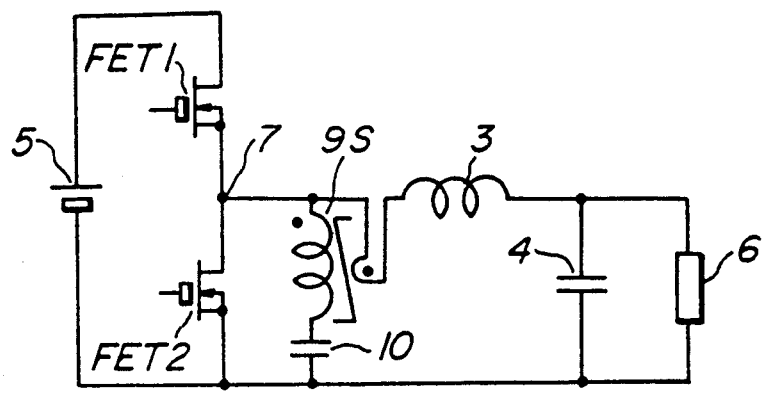
FIG_14
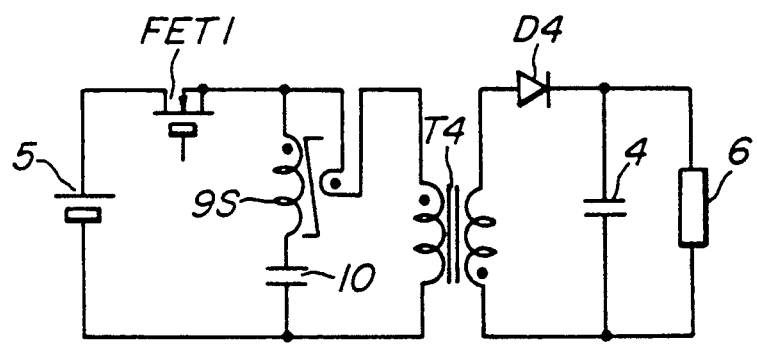

FIG_15
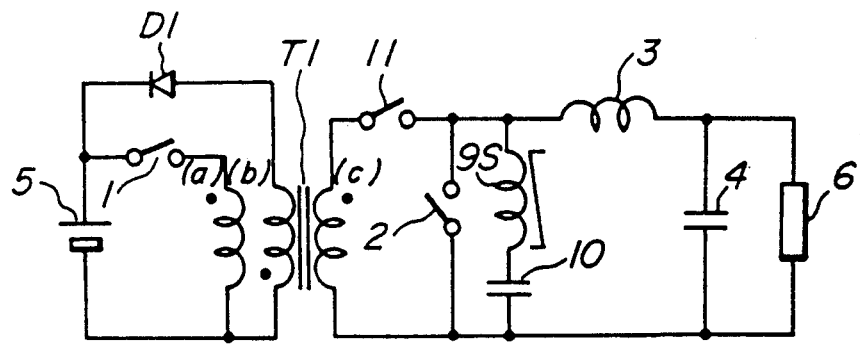
FIG_16
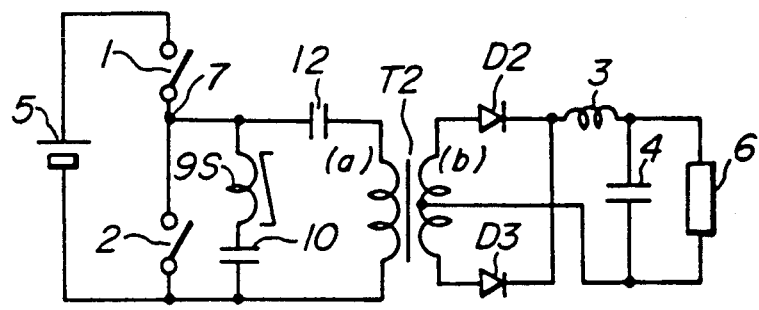
FIG_17
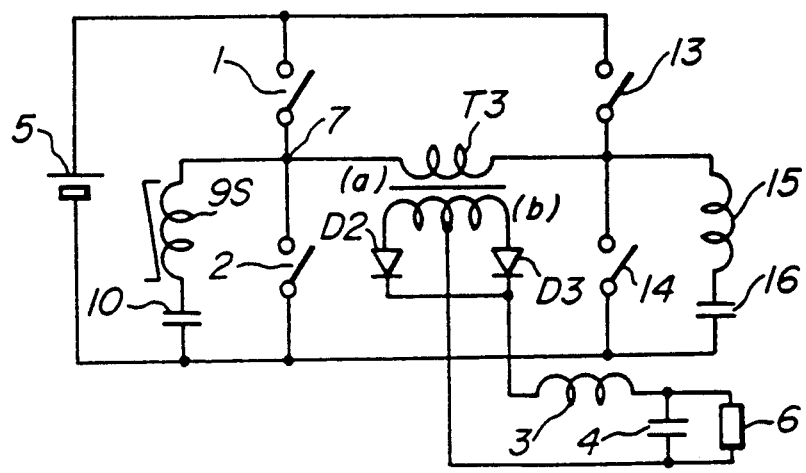

SWITCHING POWER SOURCE MEANS

CROSS-REFERENCE TO RELATED APPLICATION

This application is a Continuation-in-part of copending U.S. Pat. application Ser. No. 07/323,381 filed Mar. 14, 1989.

BACKGROUND OF THE INVENTION

1. Field of the Invention

This invention relates to a switching power source means having a DC voltage source with at least two switch elements connected thereto, so as to produce a DC output, or an AC output at a desired frequency, by turning on and off the switch elements in an alternate manner. In particular, the invention relates to prevention of surge currents and switching losses due to parasitic capacitors in the switching power source means.

2. Related Art Statement

A switching power source means of the above-mentioned type is generally small and highly efficient, and has been widely used, for instance, as a power source for a computer data processing system. In the case of a power source means with a large output capacity, or an AC power source means producing sinusoidal AC output from a DC power source, the power source means is often made controllable by connecting paired switch elements thereto so as to regulate the power or frequency of its output simply by alternately changing over the operating state of the switching elements.

FIG. 6 shows a circuit diagram of a typical example of a conventional controllable power source means. The waveforms at different points in the circuit thereof are shown in FIGS. 7A and 7B. Paired switch elements, i.e., a first switch element 1 and a second switch element 2, are joined in series at a point 7 and serially connected across a DC voltage source 5. A low-pass filter, which is formed of a choke coil 3 and a capacitor 4, is connected to the DC voltage source 5 through the first switch element 1. The input end of the low-pass filter is connected in parallel with the second switch element 2. A load 6 is connected in parallel with the output end of the low-pass filter. If switch elements 1 and 2 are alternately turned on and alternately turned off, while changing the ratio between ON-time and OFF-time of the switch element 2 in a sinusoidal manner, a series of pulse width modulated (PWM) voltage pulses are generated at the point 7 as shown by the curve in FIG. 7A. After elimination of switching frequency component and harmonics from the series of the voltage pulses by the low-pass filter made of the choke coil 3 and the capacitor 4, a sinusoidal AC output voltage can be obtained as shown by the curve in FIG. 7B.

The above functional description of the switching power source means of FIG. 6 is based on the assumptions that the switch elements 1 and 2 perform an exactly rectangular ON-OFF switching operation as ideal switch elements can do, and the control signals for driving the ON-OFF operation are also exactly rectangular. Performance of actual switch elements to be used, however, deviates from the above-mentioned exact rectangular switching operation due to intrinsic characteristics of individual switch elements, which causes certain difficulties during switching operation.

The difficulties during the switching operation will be explained by referring to a typical switch element of a metal oxide semiconductor field effect transistor (MOS-FET) of FIG. 8. MOS-FET's are quite frequently used as the switch elements 1 and 2 of FIG. 6. The circuit of FIG. 8 is essentially the same as that of FIG. 6 except that MOS-FET1 and MOS-FET2 are used as the switch elements 1 and 2 respectively.

The MOS-FET is different from a conventional bipolar transistor in that the MOS-FET is free from delay in turn-off operation due to storage time caused by residual carriers. Thus, if control signals applied to the gates of MOS-FET1 and MOS-FET2 of FIG. 8 are exactly rectangular, simultaneous ON states of the MOS-FET1 and MOS-FET2 will never occur. However, the actual MOS-FET has a comparatively large parasitic capacitor between its drain and source on the order of about several hundred pF to several ten pF. At the time of turn-ON and turn-OFF of the paired MOS-FET1 and MOS-FET2, there is a serious problem of how to handle the electric charge stored in the parasitic capacitors so as to eliminate adverse effects of the stored charge on the turning ON and turning OFF function.

FIG. 9 shows an equivalent circuit of a MOS-FET. Due to its configuration, parasitic capacitors are inevitable; namely, $C_{dg}$ between the gate and the drain, $C_{ds}$ between the drain and the Source, and $C_{gs}$ between the gate and the source. The value of resistance $R_{ds}$ between the drain and the source varies greatly from almost zero to infinity depending on the gate-source voltage, and the zero value corresponds to the ON state and the infinity value corresponds to the OFF state. A parasitic diode $D_o$ must be considered between the drain and the source.

Phenomena relating to the turn-ON and turn-OFF of the equivalent circuit of FIG. 9 will now be explained. Electric charge stored in the drain-source parasitic capacitor $C_{ds}$ of each MOS-FET is discharged through the drain-source resistance $R_{ds}$ when it is turned ON. Hence, when the paired MOS-FET's are switched over from one to the other, a large surge current is produced. For example, a large surge current flows through the ON-state drain-source resistance $R_{ds}$ of the MOS-FET2 when the MOS-FET2 is turned ON from its OFF state. The surge current is due to two reasons, namely, the drain-source parasitic capacitor $C_{ds}$ of the MOS-FET2 is discharged through the ON-state drain-Source resistance $R_{ds}$, and the drain-source parasitic capacitor $C_{ds}$ of MOS-FET1 is directly charged by the DC voltage source 5 through the ON-state drain-source resistance $R_{ds}$ of the MOS-FET2. Similarly, a large surge current flows through the ON-state drain-source resistance $R_{ds}$ of the MOS-FET1 when the MOS-FET2 is turned OFF and the MOS-FET1 is turned ON due to the same two reasons as described above.

As a result, the charge stored in the drain-source parasitic capacitor $C_{ds}$ of each MOS-FET Of the paired switch elements of FIG. 8 causes a large surge current through the ON-state drain-source resistance $R_{ds}$ when the two-MOS-FET's are switched over from one to another. The energy of such surge current is converted into and consumed as heat, which means not only power loss and temperature rise of the switch element but also generation of noise. Further, intensity of such phenomenon increases with the increase of the switching frequency of the paired switch elements. Thus, the occurrence of such surge current makes it very difficult to use high frequency switchover of the paired switch elements of the switching power source means. Further, if the peak value of such surge current is too high, it may cause break-down of the switch elements.

Several protective methods against the surge current accompanying the switchover of the switch elements have been proposed. FIG. 10A through FIG. 10C illustrate some of them. Gate resistors $8_{a1}$ and $8_{a2}$ of several hundred ohms are serially connected to the gates of the MOS-FET1 and MOS-FET2 as shown in FIG. 10A. Functions of such gate resistors include the reduction of the rise-rate of the gate-source voltage of each MOS-FET, the gradual change of the value of the drain-source resistance $R_{ds}$ of each MOS-FET at the time of switchover, and the suppression of the peak value of the surge current even if not eliminated. FIG. 10B shows the case in which two saturable magnetic cores $8_{b1}$ and $8_{b2}$ are connected in series to the MOS-FET1 and MOS-FET2, respectively. Snubber circuits $8_{c1}$ and $8_{c2}$, each comprising for instance a resistor and a capacitor, are connected in parallel to the MOS-FET1 and MOS-FET2, respectively, as shown in FIG. 10C.

The inventors found that the conventional protective methods could not ensure complete prevention of the occurrence of the above-mentioned surge current. Even if the protective methods are used, electric charge stored in the parasitic capacitors of the MOS-FET's is eventually consumed as heat in the drain-source resistance $R_{ds}$. Thus, with increase of the frequency of switchover of switch elements in the switching power source means, its power consumption or heat generation increases. In short, prevention of occurrence of the surge current and reduction of switching loss at switchover of the switch elements is a very important problem to be solved in the conventional switching power source means.

SUMMARY OF THE INVENTION

Therefore, an object of the present invention is to solve the above-mentioned problems of the prior art by providing an improved switching power source means which prevents occurrence of the surge current due to parasitic capacitors of switch elements and of a transformer, if used, so as to enable high efficiency and size reduction of such means.

A switching power source means according to the invention has a DC voltage source, a first switch element, a low-pass filter connected to the DC voltage source through the first switch element, and a second switch element connected to the input end of the low-pass filter, in which switch elements are operable in such a manner that a DC output or an AC output at a desired frequency can be produced across the output end of the low-pass filter. Further, a reactor is connected in parallel to one of the switch elements, e.g., the second switch element, to charge and discharge parasitic capacitors of the switch elements, so as to prevent the surge currents in the switch elements.

With the reactor connected across the second switch element, no surge current is caused at switchover of the switch elements, and it is made possible to provide a small yet highly efficient switching power source means which is particularly suitable for use in a DC constant-voltage power source, an inverter, an AC uninterruptible power supply, a battery charger, controllers of motors of various types, and the like.

BRIEF DESCRIPTION OF THE DRAWINGS

For a better understanding of the invention, reference is made to the accompanying drawings, in which:

FIG. 1 is a circuit diagram of the first fundamental configuration of a switching power source means according to the invention;

FIG. 3 is a circuit diagram of a forward type power source to which the switching power source means of the invention is applied;

FIG. 4 is a circuit diagram of a half-bridge type DC power source to which the switching power source means of the invention is applied;

FIG. 5 is a circuit diagram of a full-bridge type power source to which the switching power source means of the invention is applied;

FIG. 8 is a circuit diagram of the formation of a conventional switching power source means which uses MOS-FET's as switch elements;

FIG. 9 is an equivalent circuit of a MOS-FET;

FIG. 10A through FIG. 10C are circuit diagrams of conventional methods for preventing surge currents in switch elements, respectively;

FIG. 11 is a circuit diagram showing the second fundamental configuration of a switching power source according to the present invention;

FIG. 12A is a diagram showing waveforms of voltage at point 7 in the power source of FIG. 11;

FIG. 12B is a diagram showing waveforms of reactor current without bias applied in the power source of FIG. 11;

FIG. 12C is a diagram showing waveforms of reactor current with bias applied in the power source of FIG. 11;

FIG. 12D is a diagram showing waveforms of current from point 7 in the power source of FIG. 11;

FIG. 13 is a circuit diagram showing the third fundamental configuration of a switching power source according to the present invention;

FIG. 14 is a circuit diagram showing an embodiment of a backboost type switching power source according to the present invention;

FIG. 15 is a circuit diagram showing another embodiment of a forward type switching power source according to the present invention;

FIG. 16 is a circuit diagram showing another embodiment of a half-bridge switching power source according to the present invention; and FIG. 17 is a circuit diagram showing another embodiment of a full-bridge switching power source according to the present invention.

Figure 2A:
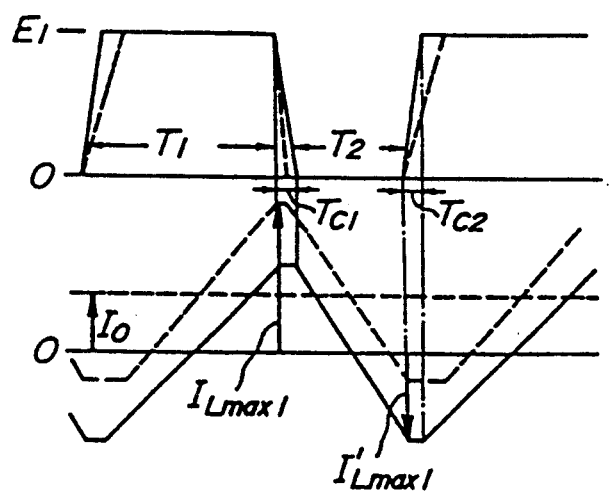
FIG. 2A shows waveforms of current and voltage at point 7 in the power source means of FIG. 1.

Throughout different views of the drawing, 1, 2, 11, 13, 14 are switch elements (MOS-FET's), 3 is a choke coil, 4, 10, 12, 16 are capacitors, 5 is a DC voltage source, 6 is a load, 7 is a point, $8_{a1}$, $8_{a2}$ are gate resistors, $8_{b1}$, $8_{b2}$ are saturable magnetic cores, $8_{c1}$, $8_{c2}$ are snubber circuits, 9, 15 are reactors, and 9S is a saturable reactor.

DESCRIPTION OF THE PREFERRED EMBODIMENT

The invention will be described in further detail by referring to embodiments.

FIG. 1 shows the basic circuit of a switching power source means according to the invention. In the figure, MOS-FET1 and MOS-FET2 are examples of switch elements 1 and 2 of the ensuing embodiments. The output voltage from the switching power source means is controlled by turning ON and turning OFF the switch elements 1 and 2 alternately so as to regulate the duration ratio of ON state and OFF state, as in the case of conventional switching power source means. At each switchover from one switch element to another, "dead time" is provided during which the two switch elements are both in OFF state.

The embodiment of FIG. 1 is different from the prior art in such a way that a series circuit of a reactor 9 and a capacitor 10 is connected across the second switch element 2 or MOS-FET2 in FIG. 1. The reactor 9 stores energy in the form of current therein during a half cycle prior to the dead time, and the stored energy is used for charging and discharging of parasitic capacitors of the switch elements during the dead time. Thus, the internal resistance of the switch elements is freed from adverse effects of charging currents to and discharging currents from parasitic capacitors of the switch elements. A capacitor 10 is used to cut off a DC component in the voltage at point 7. The capacitance of the capacitor 10 is selected in such a manner that the resonant frequency of the circuit formed of the reactor 9 and the capacitor 10 is much lower than the switching frequency of the switch elements 1 and 2. The voltage appearing across the capacitor 10, which is almost constant, depends on both the voltage of the voltage source 5 and time ratio of switching.

In operation, when the MOS-FET1 is turned ON, a current is fed from the DC voltage source 5 to the reactor 9 through the MOS-FET1 and energy is stored in the reactor 9. At the moment of turn-OFF of the MOS-FET1, the voltage at point 7 is held by the parasitic capacitors across the switches, hence FET1 is turned off with zero voltage switching. The current in the reactor 9 cannot change rapidly and it varies in a continuous manner while charging the drain-source parasitic capacitors $C_{ds}$ of MOS-FET1 and discharging the drain source parasitic capacitor $C_{ds}$ of MOS-FET2. Thus, the voltage at point 7 decreases substantially linearly. After the voltage at point 7 reaches zero, the current in the reactor 9 continues to flow through the parasitic diode $D_o$ of MOS-FET2 (see FIG. 9). In the interval of diode $D_o$ conduction, FET2 is turned ON. Thus the zero voltage switching is realized in FET2 at turn-on and there is no current surge. When FET2 is ON, the current from the reactor 9 varies at a certain slope in response to the change of the voltage of the capacitor 10 and changes its polarity.

When the switchover is from FET2 to FET1, the same kind of zero voltage switching arises. In this case, however, the direction of the current from point 7 has been reversed. When MOS-FET2 is turned OFF, parasitic capacitor $C_{ds}$ of MOS-FET2 is charged and parasitic capacitor $C_{ds}$ of MOS-FET1 is discharged by the energy stored in the reactor 9. As a result, the voltage at point 7 increases gradually until it reaches the voltage of the voltage source 5. Zero voltage switching is therefore realized at turn-off of FET2 After the voltage at point 7 reaches the voltage of voltage source 5, the energy in the reactor 9 is recovered by way of the voltage of the source 5 through the parasitic diode $D_o$ of the MOS-FET1. During the conduction of diode $D_o$ of MOS-FET1, FET1 is turned ON. Hence, zero voltage switching in FET1 is realized. When FET1 is ON, the current in the reactor 9 increases with a certain slope, and changes its polarity. Next, the same operation is repeated. The charging and discharging of the parasitic capacitors of the MOS-FET's through the drain-source resistors $R_{ds}$ of the MOS-FET's is prevented by the energy stored in the reactor 9.

Figure 2B:
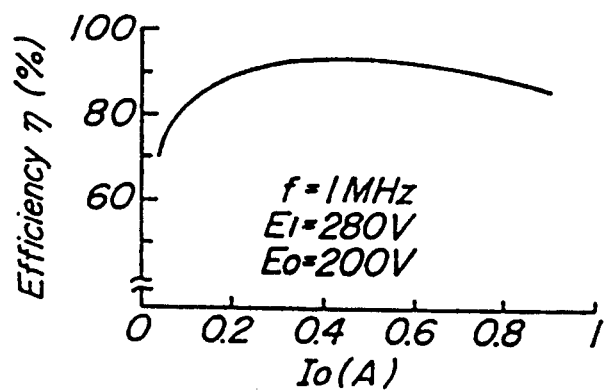
FIG. 2B shows current versus efficiency characteristics of the power source means of FIG. 1 in the case of producing an AC output.
Figure 2C:
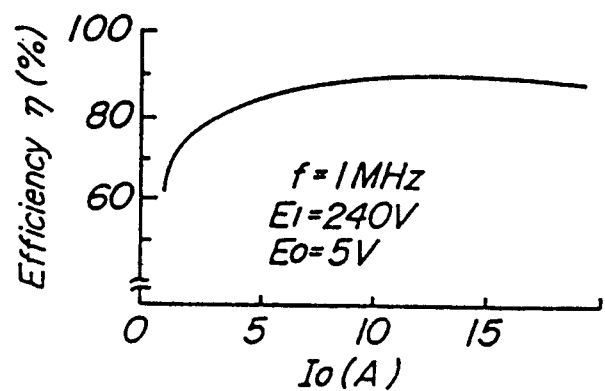
FIG. 2C shows current versus efficiency characteristics of the power source means with a circuit configuration of FIG. 4 in the case of producing a DC output.
Figure 6:
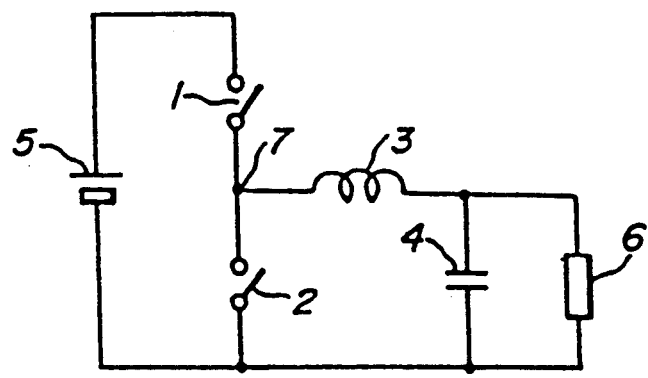
FIG. 6 is a circuit diagram of the essential configuration of a conventional switching power source means.
Figure 7A:
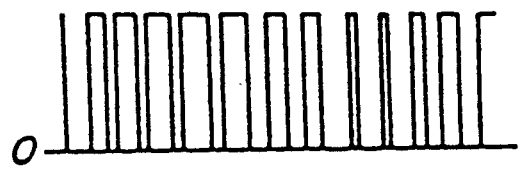
FIG. 7A and 7B show waveforms of voltages at different points of the essential configuration of FIG. 6.
Figure 7B:
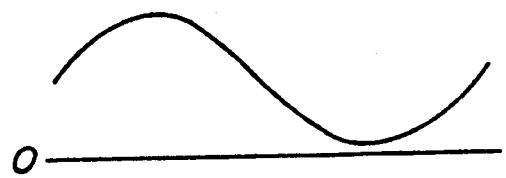

The voltage at and the current from, point 7 will be discussed now in detail. The upper graph of FIG. 2A shows the theoretical waveform of voltage at point 7, while the lower graph of FIG. 2A shows the theoretical waveform of current from point 7. In the two graphs, solid lines are for no-load conditions and dash lines are for loaded conditions. FIG. 2B and FIG. 2C show measured values of efficiency versus load current $I_o$ characteristics for the configuration of FIG. 1 and for the configuration of FIG. 4, respectively. High efficiency of the means of the invention was proved; namely, about 95% for the case of FIG. 2B and about 85% for the case of FIG. 2C.

In FIG. 1, if the voltage of the voltage source 5 is represented by Ei and the time ratio of the ON period of the switch element 1 is represented by D, a voltage $DE_i$ appears across the capacitor 10. If the inductance of the reactor 9 is designated by L, the switching frequency is designated by f and the output Current is designated by $I_o$, the peak current $I_{Lmax}$ of the reactor 9, i.e., the current through reactor 9 when both of MOS-FET1 and MOS-FET2 are OFF, can be given by the following equation.

$$I_{Lmax} = Ei(1-D)D/2fL \quad (1)$$

In deriving the equation (1), one assumption was used; namely, the switchover time between the switch elements 1 and 2 is sufficiently short as compared with the ON time of the switch element 1 or 2.

The current i through point 7 can be given by the following equation (2) for the ON time of the MOS-FET1 and by the following equation (3) for the ON time of the MOS-FET2.

$$i = [Ei(1-D)t/L] - [D(1-D)Ei/2 \cdot f \cdot L] + I_o \quad (2)$$

$$i = [Ei \cdot D \cdot t/L] + [D(1-D)Ei/2 \cdot f \cdot L] + I_o \quad (3)$$

When the MOS-FET1 or the MOS-FET2 is switched from the ON state to OFF state, the parasitic capacitors of the MOS-FET1 and MOS-FET2 are charged by the energy stored in the reactor 9, and the voltage at point 7 varies. If the total capacitance of the entire drain-source parasitic capacitors of the MOS-FET1 and MOS-FET2 as seen from point 7 is represented by C, the internal resistance of the reactor 9 is represented by r, and the current of the reactor 9 at turn-off time of the MOS-FET's is represented by $I_L$, then the voltage u at point 7 and the current i through point 7 can be given by the following equations (4) and (5) for switchover of ON state from MOS-FET1 to MOS-FET2 and by the following equations (6) and (7) for switchover of ON state from MOS-FET2 to MOS-FET1.

$$u = e^{-at}[(Ei - Ec + rI_L)\cos\omega t + \{a(Ei - Ec + rI_L) - (I_o + I_L)/C\}\cdot(1/\omega)\sin\omega t] + (Ec - rI_L) \quad (4)$$

$$i = e^{-at}[(I_oI + L)\cos\omega t + \{(Ei - Ec)/L - a(I_o + I_L)\}\cdot(1/\omega)\sin\omega t] \quad (5)$$

$$u = e^{-at}[(-Ec + rI_L)\cos\omega t + \{a(-Ec + rI_L) - (-I_o + I_L)/C\}\cdot(1/\omega)\sin\omega t] + (Ec - rI_L) \quad (6)$$

$$i = e^{-at}[(-I_o + I_L)\cos\omega t + \{(-Ec)/L + a(I_o + I_L)\}\cdot(1/\omega)\sin\omega t] \quad (7)$$

where, $a = r/2L$ and $\omega = \sqrt{1/LC - 1}$.

If the internal resistance r of the reactor 9 is sufficiently small and the time necessary for the voltage at point 7 to change into its next state is sufficiently short as compared with the intrinsic period of LC, the above equations (4) through (7) can be simplified as the following expressions (8) through (11) with a sufficient degree of approximation, respectively. For the switchover of ON state from MOS-FET1 to MOS-FET2

$$u = Ei - (I_o + I_{Lmax})\cdot t/c \quad (8)$$

$$i = I_o + I_{Lmax} + (Ei - Ec)\cdot t/C \quad (9)$$

For the switchover of ON state from MOS-FET2 to MOS-FET1

$$U = (I_{Lmax} - I_o)\cdot t/c \quad (10)$$

$$i - (-I_o + I_{Lmax}) - Ec\cdot t/c \quad (11)$$

The equations (8) through (11) show that the variation of the voltage at point 7 is substantially linear. With the condition for positive slope of the voltage of the equation (10), the peak value $I_{Lmax}$ of the reactor current and the load current $I_o$ must satisfy the following conditions.

$$i_o < I_{Lmax} = Ei(1-D)D/2\cdot f\cdot L \quad (12)$$

During the switch-over of the voltage at point 7, the two MOS-FET's must be simultaneously OFF, and the dead time Td during which both of the two MOS-FET's are OFF can be derived as follows from the equation (11).

$$Td \geq Ei\cdot C/(I_o - I_{Lmax}) \quad (13)$$

As can be seen from the foregoing description, with the circuit configuration of the invention, it is possible to completely eliminate surge currents due to the charging and discharging of parasitic capacitors of the switch elements through the internal resistances of such switch elements at switchover of switch elements. Further, values of constants necessary in the invention such as the inductance of the reactor 9 and the duration of the dead time can be determined by use of the simple equations.

With the prior art, several methods have been used to protect switch elements against the surge current at the time of switchover of the switch elements and to prevent noise in the voltage and current due to such surge currents; namely, connection of gate resistors of several hundred ohms to the gates of MOS-FET's for reducing the rate of rise of the gate voltage, suppression of the current peak value by gradually reducing the drain-source resistance of the MOS-FET to its complete ON state at the time of its turn-ON, and use of means for preventing sudden changes of voltage and current such as the snubber circuits formed of resistors and capacitors. However, such conventional methods could not ensure complete elimination of the surge current, and the electric charge stored in the parasitic capacitors of the MOS-FET's are eventually consumed in the ON-state drain-source resistance of each MOS-FET. Thus, with the increase of frequency of the switchover of the switch elements, problems of increased power consumption and increased heat generation are inevitable, and such problems have not been solved.

In the above description of the principles of the invention, MOS-FET1 and MOS-FET2 are used as examples of the switch elements 1 and 2. When bipolar transistors, gate turn off transistors (GTO), or regular thyristors are used as the switch elements of the switching power source means, parasitic capacitors of such transistors and thyristors also cause problems similar to those related to the MOS-FET's. The invention can solve the problems accompanying with the use of the above transistors and thyristors.

Thus, the invention can reduce the number of surge absorbing elements in the switching power source means compared with the conventional power source means of similar type. Since the power consumption at the time of switchover can be kept low, the frequency of the switchover can be increased, and various components such as the smoothing choke coils and capacitors can be made small. When applied to the output voltage control, the invention can permit a faster response and facilitate more sophisticated fine control of the output voltage.

Other embodiments will be described now. FIG. 3 shows a forward type switching power source to which the present invention is applied. Switch elements 1 and 2 are paired, and when one of them is ON the other is controlled to be OFF. A switch element 11 is so controlled as to turn-ON and turn-OFF substantially simultaneously with the switch element 1. During switchover of the switch elements 1, 11 and 2, the energy stored in the reactor 9 is used to charge and discharge parasitic capacitors of such switch elements 1, 11, 2 and a transformer T1.

FIG. 4 shows a half-bridge type power source, in which output end of a switching power source means of the invention is connected to the primary winding of a transformer T2 and the output is rectified by diodes D2 and D3 that are connected to the secondary winding of the transformer T2, so as to provide a DC output. Switch elements 1 and 2 are paired, and when one of them is ON the other is controlled to be OFF. The power source of FIG. 4 uses a capacitor 12 for cutting off the DC component of the output from the switching power source means of the invention. During switchover of the switch elements 1 and 2, the energy stored in the reactor 9 is used to charge and discharge parasitic capacitors of such switch elements 1, 2 and the transformer T2. Parasitic capacitors across terminals of the diodes D2 and D3 are also charged and discharged by the energy stored in the reactor 9, and surge currents due to recovery currents (reverse direction currents caused during the switchover) never occur.

FIG. 5 shows a full bridge inverter circuit. The AC voltage produced by the switching power source means of the invention is applied to the primary winding of a transformer T3, and rectified by diodes D2 and D3 connected to the secondary winding of the transformer T3. Switch elements 1 and 2 are paired, and switch elements 13 and 14 are similarly paired. When one of the paired switch elements is ON the other one of the paired switch elements is controlled to be OFF. A DC output of any desired magnitude can be produced by controlling phase difference between the switching element 1-2 pair and the switching element 13-14 pair. In this embodiment, the energy stored in reactors 9 and 15 is used to charge and discharge parasitic capacitors of the switch elements, the transformer, and the diodes during switchover of the switch elements.

The switch elements 1, 2, 13 and 14 in the embodiments of FIG. 3 through FIG. 5 can be MOS-FET's, bipolar transistors, GTO's, thyristors, or diodes.

In the embodiments as described hereinbefore in detail, the wattless current $I_L$ indicated by solid lines in the lower graph of FIG. 2A, which flows through the reactor 9 employed in the fundamental configuration shown In FIG. 1, flows through switch elements FET1 and FET2. As a result, the losses in the equivalent resistances within the switch circuits and the losses in ON-state drain-source of the switch elements are increased. Furthermore, in order to effectively charge and discharge the parasitic capacitors across the switch elements, it is required that the amplitude value $I_{Lmax}$ of the reactor current be larger than that of the load current $I_o$, as described before.

On the other hand, a current corresponding to the sum of the load current $I_o$ and the reactor current $I_L$, that is, the Current indicated by dash lines in the lower graph of FIG. 2A, flows from point 7 in the fundamental configuration as shown in FIG. 1, and, as a result, a peak current equal to twice of the load current $I_o$ flows through the switch elements FET1 and FET2 with maximum load. Therefore, it is required to select semiconductor devices having a large current capacity for the switch elements FET1, FET2. Moreover, a wattless current with a peak value larger than the load current $I_o$ always flows through the reactor 9. Hence, it is required to increase the diameter of the windings of the reactor 9 for reducing the power loss caused on the reactor 9.

In order to remove the above-mentioned defects of the switching power source of a reactor-current diversion type based on the fundamental configuration as shown in FIG. 1 according to the present invention, in which a reactor is connected in parallel with switch elements to divert the charging and discharging currents of parasitic capacitors of those switch elements into a reactor current, a saturable core is used for the reactor concerned, so as to give a non-linear property thereto and hence to make the most of the merit of the reactor-current diversion. Moreover, if the reactor made of a saturated core, is further provided with an additional winding through which the load current flows, so as to be applied with a bias current in response to the load current, the most profitable charging and discharging current required for the reactor-current diversion can be always obtained.

A second fundamental configuration of the improved switching power source of the present invention is shown in FIG. 11. In the original fundamental configuration, when switch element FET1 is in the ON-state, the voltage stored in the parasitic capacitor across the drain and the source of the switch element FET1 is zero, while the source voltage Ei is applied to the parasitic capacitor across the drain and the source of switch element FET2. In this condition, when the switch element FET1 is turned OFF at a fairly high switching speed, the switching is completed in a condition so what the electric charge stored in the parasitic capacitor across the drain and the source of the switch element FET1 is substantially zero. However, when switch element FET2 is turned ON immediately after the switch element FET1 is turned OFF, both the discharge current of the parasitic capacitor of FET2 and the charge current of the parasitic capacitor of FET1 flow through the conduction resistance of switch element FET2. As a result, an abrupt, large surge current is generated within the switch element FET2, and hence the heat and the noise are further generated.

In contrast therewith, in the improved fundamental configuration, a saturable reactor 9S is connected across the switch element FET2, so that the core of the reactor 9S is saturated a little while before one of the switch elements, for instance, FET1 is turned OFF. As a result, a reactor current having an operational waveform as shown in FIG. 12B flows through the saturable reactor 9S. FIGS. 12A through 12D show several operational waveforms in the improved fundamental configuration. In other words, during the saturation of the saturable reactor 9S, a current supplied from the DC voltage source 5 through the switch element FET1 is stored in this saturated saturated reactor 9S. When a dead time having a duration of a suitable time length is provided after the switch element FET1 is turned OFF, the current flowing through the saturable reactor 9S tends to maintain the present state of current flow. Hence, the electric charge stored in the parasitic capacitor across the drain and the source of the switch element FET2 is discharged, while the parasitic capacitor across the drain and the source of the switch element FET1 is charged by the peak of this maintained current. As a result, the terminal voltage across the switch element FET2 decreases with a certain inclination. If switch element FET2 is turned ON after this terminal voltage reaches zero, zero voltage switching can be realized.

Moreover, even when the ON state is switched over from switch element FET2 to switch element FET1 zero voltage switching similar to the above can be realized by providing a dead time duration of suitable time length similar to the above, and furthermore, since the current flowing through the reactor 9S is the wattless current, those currents flowing to charge and to discharge the parasitic capacitors do not cause any power loss at all. Furthermore, since the inclination of the variation of terminal voltages across the switch elements FET1 and FET2 is determined by the capacitance of the parasitic capacitors across those elements, the peak value $I_{Lmax}$ of the reactor current, and the load current $I_o$, the power loss and the noise, which are caused by the abrupt change of the current or the voltage, that is, the surge current or the surge voltage, can be prevented by selecting suitable values of those causing factors.

In this connection, the current, which charges or discharges the parasitic capacitors across the switch elements FET1 and FET2, corresponds to the sum of the reactor current $I_L$ and the load current $I_o$ in the case when the ON state is switched over from the switch element FET1 to the switch element FET2, while the current of concerned corresponds to the difference between the reactor current $I_L$ and the load current $I_o$ in the case when the ON state is switched over from the switch element FET2 to the switch element FET1. Consequently, if the peak values of the reactor currents $I_L$ flowing through the current-diversion reactor 9S are equal to each other, the inclination of the terminal voltage across the switch element becomes steep in the case when the ON state is switched over from the switch element, FET1 to the switch element FET2, while the inclination of concern becomes gentler. As a result, when the load current $I_o$ exceeds the peak value $I_{Lmax}$ of the reactor current, the current diversion through the reactor 9S cannot be realized.

However, the aforesaid difficulty can be removed by providing the core of the saturable reactor 9S with an additional winding through which the load current $I_o$ flows, so as to apply a bias current in response to the load current $I_o$ to the saturable core. An example of the configuration of the switching power source of the present invention in which the core of the saturable reactor 9S is applied with the bias current in response to the load current $I_o$ is shown in FIG. 13, while the waveforms of the reactor current $I_L$ and the current flowing from point 7 in the example shown in FIG. 13, are shown in FIGS. 12C and 12D respectively. In the configuration as shown in FIG. 13, which is arranged so that the bias current responding to the load current is applied to the core of the saturable reactor 9S, the positive peak value of the reactor current $I_L$ is decreased, while the negative peak value thereof is increased, as shown in FIGS. 12C and 12D. As a result, the saturable core is appropriately biased, such that an excessive peak current flowing through the switch elements on the bias of an increased load current $I_o$, can be prevented, while the charging current or the discharging current of the parasitic capacitor, which is required for the reactor current diversion, can be provided. Furthermore, at the instant at which the terminal voltages across the switch elements are switched over between each other, the current flowing from point 7 is maintained constant, so that the inclination of the voltage variation at this instant is also maintained constant, and hence the noise caused by the abrupt change of the voltage can be prevented, too.

As described above, in the reactor current diversion type switching power source of the present invention, a saturable core is used for the current diversion reactor, so that the condition required for realizing the charge and the discharge of parasitic capacitors across the switch elements is always satisfied, and hence it is possible to prevent the power loss caused by the larger wattless current which tends to be generated when the current diversion reactor is formed of an air-core linear reactor without saturation of core.

The principle of the improvement of the switching power source according to the present invention shown in FIG. 11, which is provided by modifying the original fundamental configuration shown in FIG. 1, can be generally applied to any kind of switching power source in which paired switch elements are controlled to be alternately switched over. Therefore, the embodiments of the present invention shown in FIGS. 3 to 5 which are variations of the original fundamental configuration shown in FIG. 1, can be applied with the same principle of improvement together with the same effect. For example, an embodiment of the switching power source according to the present invention, in which the aforesaid principle of improvement is applied to a power source of backboost type, is shown in FIG. 14, another embodiment thereof, in which the aforesaid principle of improvement is applied to a forward type power source as shown in FIG. 3, being shown in FIG. 15, another embodiment thereof, in which the aforesaid principle of improvement is applied to an inverter rectifying DC power source as shown in FIG. 4, being shown in FIG. 16, and another embodiment thereof, in which the aforesaid principle of improvement is applied on a full-bridge type power source as shown in FIG. 5, being shown in FIG. 17. In other words, the principle of improvement according to the present invention can be generally applied to the switching power sources of this kind including various bridge type power sources and hence similar effects of improvement can be obtained.

As can be seen from the foregoing detailed description, the outstanding effects of the invention can be summarized as follows.
(1) A high efficiency of electric power in the switching power source means is achieved.
(2) Due to the reduction of heat generation at constituent elements, heat dissipating fins and
(3) Reliability of the constituent elements is improved because surge currents are substantially eliminated.
(4) Need of conventional fringe elements such as snubber circuits and noise filters can be removed.
(5) Higher switching frequencies than before can be used, and size of circuit elements such as transformers and filters can be reduced.
(6) Any excessive voltage is not applied to constituent elements, so that semiconductor devices having low voltage-endurance can be employed for those constituent elements.
(7) The regulation of the output of the switching power source means is accomplished by controlling the ON-OFF duty ratio of the switch elements.

Although the invention has been described with a certain degree of particularity, it is understood that the present disclosure has been made only by way of example and that numerous changes in details of construction and parts may be resorted to without departing from the scope of the invention as hereinafter claimed.

What is claimed is:

1. A switching power source, comprising:
   a DC voltage source;
   a first switch element connected to said DC voltage source;
   low-pass filter means having an output end for connection to a load and an input end selectively connectable to said DC voltage source through said first switch element;
   a second switch element connected in parallel relative to the input end of said low-pass filter means, said first and second switch elements each comprising a MOS-FET having parasitic capacitors and being turned on and off so that an output signal of desired frequency is produced at the output end of said low-pass filer means;
   a reactor connected in parallel with said second switch element for charging and discharging said parasitic capacitors during a switching operation hen said first switch element is switched off and said seconds witch element is switched on, and vice versa, said reactor including a saturable core for giving a non-linear property to said reactor; and
   a capacitor connected in series with said reactor so that the series connection of said reactor and said capacitor is in parallel with said second switch element, wherein said first and second switch elements are directly connected together at a common connection point, and the series connection of said reactor and said capacitor is connected directly to said common connection point.

2. A switching power source as defined in claim 1, wherein said first switch element has an electrode connected to a positive plea of said DC voltage source and said second switch element has an electrode connected to a negative pole of said DC voltage source.

3. A switching power source as claimed in claim 1, wherein said saturable core provided in said reactor is provided with an additional winding through which a load current flows for applying a bias current in response to the load current on said saturable core.

4. A switching power source as claimed in claim 1 wherein the output regulation of said switching power source is accomplished by pulse-width modulation.

5. A switching power source, comprising:
a DC voltage source;
a first switch element connected to said DC voltage source;
low-pass filter means having an output end for connection to a load and an input end selectively connectable to said DC voltage source through said first switch element;
a second switch element connected in parallel relative to the input end of said low-pass filter means, said first and second switch elements each comprising a MOS-FET having parasitic capacitors and being turned on and off so that an output signal of desired frequency is produced at the output end of said low-pass filter means;
a reactor connected in parallel with said second switch element for charging and discharging said parasitic capacitors during a switching operation when said first switch element is switched off and said seconds witch element is switched on, and vice versa, said reactor including a saturable core for giving a non-linear property to said reactor; and
a transformer connected between said first switch element and said low-pass filer means.

6. A switching power source as defined in claim 5, wherein said transformer has a primary circuit and a secondary circuit, said DC voltage source and said first switch element being connected in said primary circuit, and said second switch element and said reactor being connected in said secondary circuit.

7. A switching power source as defined in claim 5, and further comprising: a third switch element connected in series with both said second switch element and said reactor, said third switch element being controlled to turn on and off substantially simultaneously with said first switch element, and said third switch element and said transformer having parasitic capacitors which are charged and discharged by said reactor.

8. A switching power source as defined in claim 5, and further comprising: a capacitor connected in series with said reactor so that the series connection of said reactor and said capacitor is in parallel with said second switch element; wherein said transformer has a primary circuit and a secondary circuit, and said DC voltage source, first and second switch elements and series connection of said capacitor and reactor are all connected in said primary circuit, and said secondary circuit includes diode means for rectifying the output signal to produce a DC output.

9. A switching power source as defined in claim 5, and further comprising: a first capacitor connected in series with said reactor so that the series connection of said reactor and said first capacitor is in parallel with said second switch element; and wherein said first and second switch elements having a common connection point and further comprising a second capacitor connected between said common connection point and said transformer.

10. A switching power source as defined in claim 5, wherein said transformer has a primary circuit including a primary winding and said first and second switch elements having a common connection point connected at one end of said primary winding, and further comprising third and fourth switch elements having a common connection point connected at the other end of said primary winding and a second reactor, having a saturable core for giving a non-linear property to said second reactor, connected to said common connection point so as to be n parallel with said fourth switch element, said third switch element being connected to said DC voltage source, wherein said third and fourth switch elements and said second reactor operate similarly to said first and second switch elements and said reactor, respectively, to produce a full bridge inverter circuit.

11. A switching power source as defined in claim 10, and further comprising a first capacitor connected in series with said reactor so that the series connection of said first capacitor and said reactor is in parallel with said second switch; and a second capacitor connected in series with said second reactor, the series connection of said second capacitor and said second reactor being in parallel with said fourth switch element.

12. A switching power source as claimed in claim 10, wherein said saturable core provided in said reactor is provided with an additional winding through which a load current flows for applying a bias current in response to the load current on said saturable core.

13. A switching power source as claimed in claim 10, wherein the output regulation of said switching power source is accomplished by pulse-width modulation.

14. A switching power source, comprising:
a DC voltage source;
a first switch element connected to said DC voltage source;
low-pass filter means having an output end for connection to a load and an input end selectively connectable to said DC voltage source through said first switch element;
a second switch element connected in parallel relative to the input end of said low-pass filter means, said first and second switch elements having parasitic capacitors and being turned on and off so that an output signal of desired frequency is produced at the output end of said low-pass filter means;
a reactor connected in parallel with said second switch element for charging and discharging said parasitic capacitors during a switching operation when said first switch element is switched off and said second switch element is switched on, and vice versa; and
a capacitor connected in series with said reactor so that the series connection of said reactor and said capacitor is in parallel with said second switch element, wherein said first and second switch elements have a common connection point, and the series connection of said reactor and said capacitor is connected to said common connection point, wherein the output regulation of said switching power source is accomplished by pulse-width modulation.

* * * * *